United States Patent [19]

Hoeg, Jr. et al.

[11] Patent Number: 4,458,407
[45] Date of Patent: Jul. 10, 1984

[54] PROCESS FOR FABRICATING SEMI-CONDUCTIVE OXIDE BETWEEN TWO POLY SILICON GATE ELECTRODES

[75] Inventors: Anthony J. Hoeg, Jr., Cary; Charles T. Kroll, Raleigh; Geoffrey B. Stephens, Cary, all of N.C.

[73] Assignee: International Business Machines Corporation, Armonk, N.Y.

[21] Appl. No.: 481,212

[22] Filed: Apr. 1, 1983

[51] Int. Cl.³ .......................................... H01L 21/04
[52] U.S. Cl. ........................................ 29/571; 29/578; 29/576 E; 148/1.5; 357/23; 357/59; 357/92
[58] Field of Search ............... 29/571, 576 E, 578, 29/576 B; 148/1.5; 357/23, 59, 92

[56] References Cited

PUBLICATIONS

DiMaria et al., "Dual Electron Injector Structure", Appl. Phys. Lett. 37(1), Jul. 1, 1980, pp. 61–64.
DiMaria et al., "Electrically-Alterable read-only-memory using Si-rich SiO2 Injectors and a Floating Polycrystalline Silicon Storage Layer" J. Appl. Phys. 52(7), Jul. 1981, pp. 4825–4842.
DiMaria et al., "Dual-Electron-Injector-Structure Electrically Alterable Read-Only-Memory Modeling Studies", IEEE Trans. Elec. Dev., vol. ED 28, No. 9, Sep. 1981, pp. 1047–1053.
Falcony et al., "Study of Charge Trapping as a Degradation Mechanism in Electrically Alterable Read-Only-Memories", J. Appl. Phys. 53(1), Jan. 1982, pp. 43–47.

Primary Examiner—Brian E. Hearn
Assistant Examiner—David A. Hey
Attorney, Agent, or Firm—Joscelyn G. Cockburn

[57] ABSTRACT

A process for placing non-continuous Dual Electron Injection Structures (DEIS) between two layers of polysilicon used to form an array of poly devices on an integrated circuit substrate. Separate masks are used to define Poly 1 and Poly 2 devices, respectively. The DEIS structure is disposed above the poly 1 devices. A silicon nitride ($Si_3N_4$) layer is used to mask the DEIS structure and prevents it from oxidizing during certain processing steps. A thin layer of poly x is placed between the DEIS structure and the $Si_3N_4$. The poly x layer forms a buffer and protects the DEIS during an etching step which removes the $Si_3N_4$ layer.

14 Claims, 7 Drawing Figures

PROCESS FOR FABRICATING SEMI-CONDUCTIVE OXIDE BETWEEN TWO POLY SILICON GATE ELECTRODES

CROSS REFERENCE TO RELATED PATENT APPLICATION

U.S. patent application Ser. No. 350,530, filed on Feb. 19, 1982, entitled "Electrically Alterable Read-Out Storage Cell and Method of Operating Same," and assigned to the assignee of the present invention, describes a memory array having memory cells each including a floating gate FET and associated DEIS structure. The application describes means for controlling the reading, writing and erasing of the cells. The process of the present invention may be used to fabricate the memory array of the referenced application.

BACKGROUND OF THE INVENTION

1. Field of the Invention

The invention relates generally to semiconductor memory devices. Particularly, the invention relates to Electrically Erasable Programmable Read-Only Memory ($E^2$PROM) or Electrically Alterable Read-Only Memory (EAROM) and to Non-Volatile Random Access Memory (NVRAM).

2. Prior Art

The use of $E^2$PROM as a semiconductor memory device is well known in the prior art. In such devices charge stored on a floating gate of an FET of each memory cell is used to represent a logical "0" or a logical "1". When a particular memory cell is addressed, the state of the charge on the floating gate determines whether or not the channels of the FET of which the floating gate forms a part is conductive and hence the amount of current which flows through the selected cell.

The prior art describes several methods for transferring charge to and from the floating gate. Charging of the floating gate is often referred to as "programming" and the transfer of charge from or discharging the floating gate is referred to as "erasing." In an article entitled, "An Electrically Alterable ROM and It Doesn't Use Nitride," by J. W. Kelley et al (*Electronics*, Dec. 9, 1976, p. 101 et seq), avalanche electron ejection is used to program a Read Only Memory (ROM) and avalanche hole injection is used to erase the ROM. In another article entitled "Electrically Alterable 8192 Bit N-Channel MOS PROM," by R. G. Miller et al (JSSCC Proceedings, February 1977, p. 188 et seq), a "hot" electron injection method is used for programming and the so-called Fowler-Nordheim emission technique is used for erasing. U.S. Pat. No. 4,099,196, Ser. No. 810,912, filed June 29, 1977, issued July 4, 1978 to Simko, teaches a memory cell utilizing both oxide conduction for both programming and erasing. Other memory devices which use "hot" electron injection for programming and oxide conduction (tunneling) for erasing are described in U.S. Pat. No. 4,119,995, Ser. No. 778,574, filed Mar. 17, 1977, issued Oct. 10, 1978 to Simko, and an article entitled, "An Electrically Alterable Nonvolatile Memory Cell Using a Floating Gate Structure," (IEEE JSSC, April 1979, p. 498 et seq).

Although the above techniques work well for their intended purposes, they suffer from a common drawback. In all cases the techniques require relatively large power consumption, high field conductive path and long times for programming and erasing.

The prior art attempts to solve the aforementioned problems by conducting charge through an oxide structure in order to charge and/or discharge the floating gate. U.S. Pat. No. 4,203,158 (Ser. No. 969,819, filed Dec. 15, 1978, issued May 13, 1980) to DiMaria et al is an example of such structures. In the patent a graded layer of silicon rich silicon dioxide in conjunction with a thermal silicon dioxide between a silicon substrate and a metal electrode is used to conduct the charge. This structure is commonly referred to as a Single Electron Injection Structure (SEIS) because of its ability to lower the electric field for injection of electrons for one polarity of applied field. U.S. Pat. No. 4,099,196 (Ser. No. 810,912, filed June 29, 1977, issued July 4, 1978) to Simko describes a triple layer polysilicon cell for use in an $E^2$PROM. Silicon dioxide ($SiO_2$) is used as the conductive path to the floating gate. The $SiO_2$ is thermally grown from a rough surfaced, lightly doped polysilicon gate electrode.

In yet another improvement, the prior art uses a Dual Electron Injection Structure (DEIS) as the medium for transferring electrons to and from the floating gate. The DEIS material is a composite of three layers of silicon dioxide which has been chemically vapor deposited so that the lower and upper layers have excess silicon atoms which when placed adjacent to lower and upper conductive electrodes of polysilicon causes a conduction of electron through the middle silicon dioxide layer at a reduced electric field. The middle layer prevents tunneling of charge at a lower electric field preventing the loss of charge from the floating gate in the nonvolatile memory cell.

A nonvolatile memory cell including a DEIS structure is disclosed in an article entitled "Dual Electron Injector-Structure Electrically Alterable Read-Only Memory Model Studies," DiMaria et al (IEEE Transactions on Electronic Devices, Vol. ED-28, No. 9, September 1981) and copending patent application Ser. No. 124,003, filed February 26, 1980, and assigned to the assignee of the present invention. The memory device uses a cell structure composed of an n-channel MOS transistor with a DEIS structure positioned between a control gate and a "floating" polycrystalline silicon gate. A negative voltage is applied to the control gate to effectuate writing of the cell. This negative voltage causes the injection of electrons from the top silicon rich $SiO_2$ injector layer of the DEIS structure to the floating polysilicon layer. Likewise, the cell is erased by applying a positive voltage to the control gate. The gate ejects electrons from a bottom silicon-rich ($SiO_2$) injector layer of the DEIS material to the floating polysilicon layer.

Other examples of memory cells using a DEIS material or the like to transfer charge to and from a floating gate FET are disclosed in U.S. patent applications Ser. Nos. 192,579 filed Sept. 30, 1980; 192,580 filed Sept. 30, 1980; and 219,285 filed Dec. 22, 1980.

Because of the effectiveness with which the DEIS material transfers charges to and from a floating gate, it is desirable to incorporate it in a multiple layer polysilicon storage structure. However, the DEIS rapidly oxidizes to silicon dioxide during a typical oxidation step. Once the DEIS oxidizes it loses its effectiveness. Due to the lack of a suitable process which prevents the DEIS from oxidizing, the prior art has failed to capitalize on its use in a multiple poly process.

SUMMARY OF THE INVENTION

It is therefore the object of the present invention to provide a novel process which enables a DEIS material to be incorporated in a nonvolatile storage having multiple poly devices.

The process utilizes a layer of non-oxidizing material to mask the DEIS material and prevent it from oxidizing during a typical gate oxidation step.

Particularly, floating polysilicon gate FETS are formed on a silicon substrate. A DEIS structure is formed relative to each of the floating gate structure. A layer of polysilicon is placed next to the DEIS. A non-oxidizing material (such as silicon nitride $Si_3N_4$) is deposited on the polysilicon layer. The $Si_3N_4$ layer protects the DEIS material from oxidizing during subsequent process steps in which the DEIS structure and the floating gates are passivated. The $Si_3N_4$ and portion of the polysilicon layer is etched away and a last layer of polysilicon is deposited on the DEIS structure. The last layer of polysilicon (Poly 2) is used to form a second layer of interconnections and gate electrodes.

The foregoing and other features and advantages of the invention will be apparent from the following more particular description of the preferred embodiment of the invention as illustrated in the accompanying drawings.

DETAILED DESCRIPTION OF THE INVENTION

Figure 1:
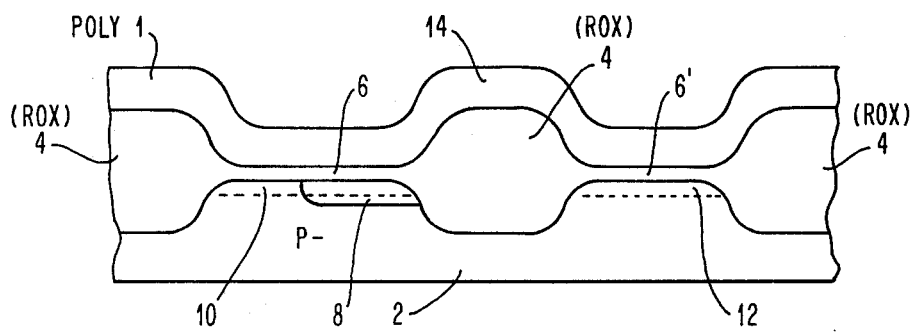
FIGS. 1 through 6 show in cross-section a sequence of diagrams which depict the $E^2PROM$ at each stage of the process. The process enables the positioning of DEIS material between two polysilicon layers thereby enabling the formation of Poly 1 and Poly 2 devices on a single substrate.

FIG. 1 shows a cross-sectional view of a polysilicon gate FET. The structure is fabricated through the formation of recessed oxide (ROX), gate oxidation, and polysilicon gate deposition process. The process steps utilized to form the structure of FIG. 1 are as follows:

A P-negative silicon substrate 2 is initially oxidized in steam and oxygen to a thickness of approximately 40 nm. The wafer is coated with a 100 nm of silicon nitride using well known chemical vapor deposition (CVD) techniques. This layer is covered with photoresist and patterned to expose portions of the silicon nitride layer to an rf plasma etch which removes the layer over the regions 4, where thick oxide is to be grown. After ion implanting boron through the 40 nm oxide is regions 4 and stripping the photoresist, the wafer is thermally oxidized in steam and oxygen to a thickness of 650 nm in the regions 4. The remaining silicon nitride is then removed in an unmasked etch using 180° C. $H_3PO_4/H_2SO_4$.

The 40 nm oxide is next removed in buffered HF and the first gate oxide 6, 6' is grown to a thickness of 45 nm. An unmasked boron implant is used to achieve the desired threshold voltage for the field effect transistors (FET's), to be formed in regions 10 and 12. The coupling diffusion 8 is implanted through the oxide 6 using photoresist masked ion implant. The first polysilicon layer 14 is then deposited using CVD at a thickness of 400 nm. Preferably the polysilicon is doped with phosphorous as it is being deposited. The technique described so far is one of the well-known prior art techniques used to deposit a poly 1 layer on a silicon substrate. Of course, other well known techniques may be used without departing from the scope of the present invention.

The structure of FIG. 1 is now processed in accordance with the teachings of the present invention. The structure of FIG. 1 is now annealed at 1000° C. in an inert ambient such as nitrogen ($N_2$) to allow the polysilicon layer 14 to partially recrystallize so that the grain size is stable during subsequent hot process steps. An in situ chemical vapor deposition is used to deposit a 20 nm layer 16 of silicon rich oxide (SRO), a 15 nm layer 18 of silicon dioxide, and a 20 nm layer of silicon rich oxide, FIG. 2. Preferably, a low pressure CVD reactor is used to deposit the SRO and silicon dioxide layers. The preferred conditions for the silicon rich layers 16 and 20 (in the low pressure CVD reactor) are a flow rate of 15 cc/minute of 100% silane ($SiH_4$)165 cc/minute of nitrous oxide ($N_2O$), a temperature of 750° C. and a pressure of 750 millitorr. The index of refraction is approximately 1.8 for these layers. The silicon dioxide layer 18 is deposited at 15 cc/minute of $SiH_4$ 730 cc/minute of $N_2O$ at 750 millitorr and 725° C.

A thin layer of polysilicon 22 is then deposited in a CVD reactor to a thickness of approximately 50 nm. This layer is not doped.

A plasma enhanced CVD reactor is then used to deposit a 30 nm layer 24 of silicon nitride.

Figure 2:
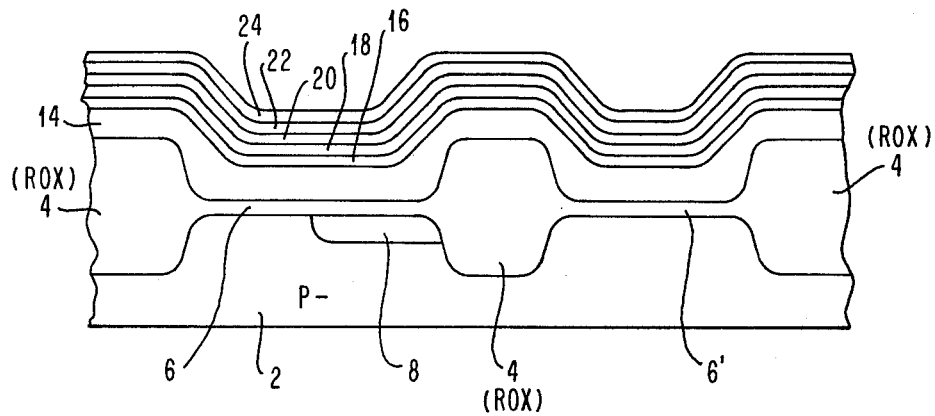
Figure 3:
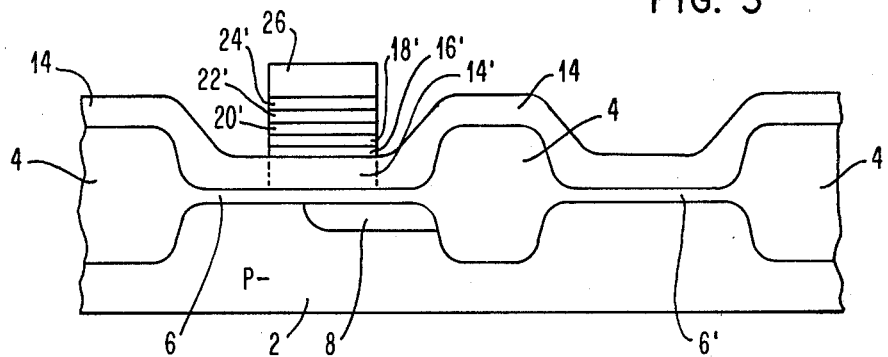

The structure or wafer of FIG. 2 is then patterned with photoresist 26 (FIG. 3). The exposed wafer is then etched in a plasma etch using DE-100, a proprietary mixture of $CF_4+O_2$ from the Scientific Gas Products Company of South Plainfield, N.J. The mixture etches the deposited $Si_3N_4$ layer 24 at 70 nm/minute and the undoped polysilicon layer 22' at 80 nm/minute. The SRO layer 20' etches at 1 nm/minute and serves as an etch stop (layer of relatively slow etch rate) in the plasma etch conditions. The SRO layers 20', 16' and the silicon dioxide layer 18' are then etched in 20 to 1 diluted buffered HF with the polysilicon layer 14' serving as etch stop. At this point the polysilicon layer 14' may be etched in the plasma etch using DE-100 if it is desirable to have a coincident definition with the SRO regions 16', 20' and polysilicon region 14' of FIG. 3.

In the preferred embodiment of this invention the polysilicon layer 14 is given a different pattern from that of the SRO regions. To this end photoresist 26 is stripped and the wafer is annealed at 800° C. in $N_2$ which densifies the plasma deposited silicon nitride region 24' which minimizes the formation of oxynitride on the surface of region 24' during a later oxidation step. It is worthwhile noting that the purpose of the silicon nitride in region 24' is to prevent oxidation of the underlying silicon rich oxide during the thermal oxidation step which is used to passivate first polysilicon layer regions to be defined.

Figure 4:
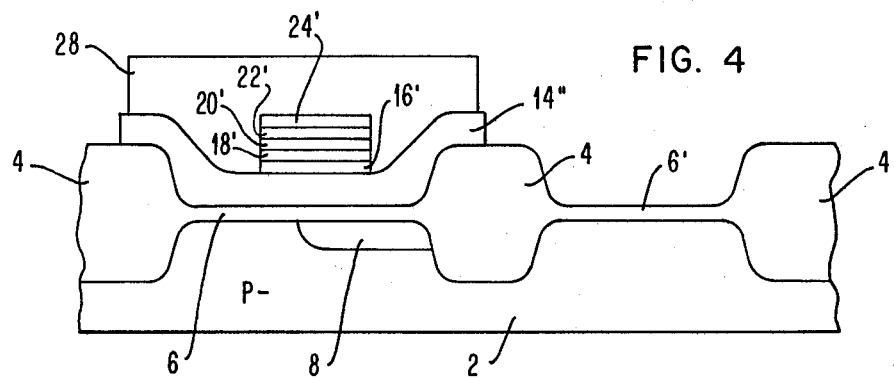

Referring now to FIG. 4, the wafer is next patterned with photoresist 28. The photoresist protects the previously defined regions 16', 18', 20', 22' and 24'. It also defines the polysilicon floating gate electrode 14'' (FIG. 4). It also protects other gates and polysilicon interconnection during a plasma etching step using DE-100.

Figure 5:
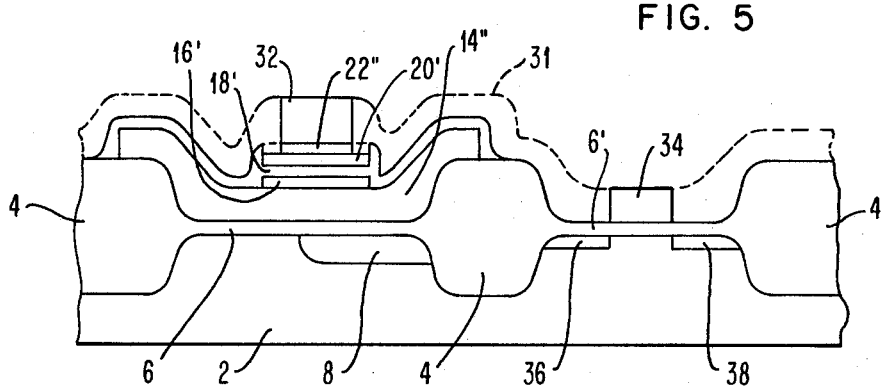

Continuing with the process sequence, the exposed gate oxide region 6' is etched back to the silicon surface using buffered HF, the photoresist 28 is stripped and the wafer is thermally oxidized in a steam and oxygen ambient at 800° C. (FIG. 5). The gate oxide 6' is regrown to 45 nm while the field oxide in region 4 grows very little and the polysilicon 14" (FIGS. 4 and 5) oxidizes at a faster rate to about 200 nm. The polysilicon 22' oxidizes on the exposed side walls by a similar amount. The exposed side walls of the silicon rich oxide regions 16' and 20' also oxidizes to $SiO_2$, thus totally insulating the floating gate electrode 14" (FIG. 5).

Figure 6:
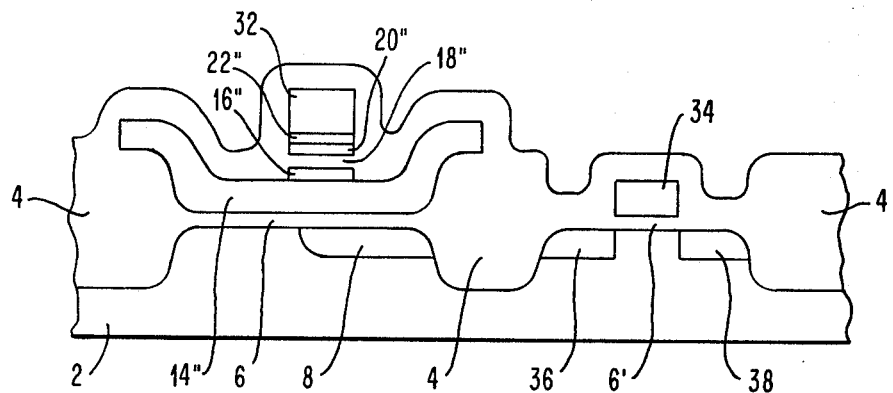

A plasma etch using DE-100 is then used to remove the silicon nitride region 24' (FIG. 4) and a portion of the polysilicon region 22'. No mask is required since the etchant has a very slow etch rate on the exposed silicon dioxide regions compared to the silicon nitride and polysilicon. The wafer is then layered with a third layer of polysilicon 31 (FIG. 5). The third layer of polysilicon is used to form the second layer of interconnections and gate electrode. A photoresist is patterned to etch the program/erase electrodes 32 (FIGS. 5 and 6) as well as polygate electrode 34 using DE-100 in an RF plasma. During the etching of polysilicon layer 32 the remainder of the polysilicon region 22' (FIG. 5) not covered by the electrode 32 is removed leaving region 22".

After removing the photoresist the source/grain regions 36 and 38 (FIG. 6) are implanted with arsenic with a thick field oxide region 4 and polysilicon regions 14", 34 masking the implant.

Figure 7:
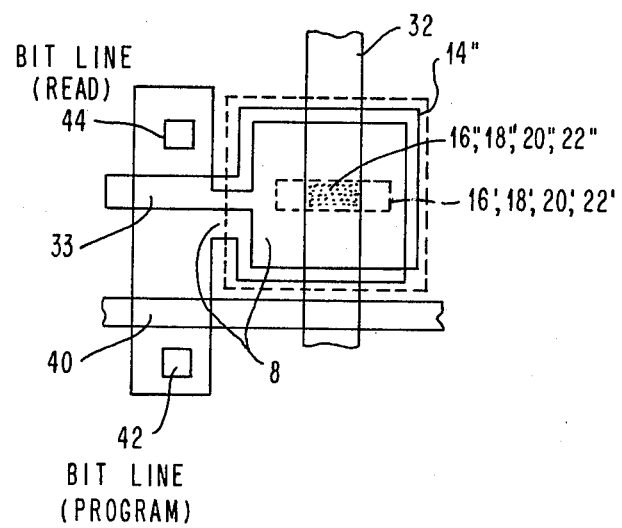
FIG. 7 shows a top view for a single cell of the $E^2$-PROM.

The source/drain diffusions are driven to their final junction depth of 500 nm at 1000° C. in steam and/or oxygen which also grows 200 nm of $SiO_2$ over the diffusions and 300 nm of silicon dioxide over the polysilicon surfaces and sidewalls. The SRO, $SiO_2$, SRO regions 16", 18", 20" covered by the polyelectrode 32 are also oxidized leaving the structures 16"', 18"', 20"' of FIG. 6. Windows (not shown) are then etched in the oxide to make electrical contact to the diffusions and polysilicon electrode. Metal patterns (not shown) are appropriately defined to complete the structure. FIG. 7 shows a top view of the floating gate structure formed from the above described processing steps. In the figure the floating gate channel region 33, the word line 40, the bit line program node 42, and the bit line read node 44 are also depicted. This concludes the description of the process.

Having thus described our invention, what we claim as new, and desire to secure by Letters Patent is:

1. A method for incorporating a non-continuous DEIS material between two layers of polysilicon in an array of devices on an integrated circuit substrate comprising the following steps:
   (a) fabricating a silicon substrate with at least one thin oxide region surrounded by thick oxide region;
   (b) depositing a first polysilicon gate interconnect layer on the substrate;
   (c) depositing on the said first polysilicon gate interconnect layer a first layer of silicon rich oxide, a layer of silicon dioxide, a second layer of silicon rich oxide, a second layer of polysilicon and a layer of non-oxidizing material with the layers being deposited in the order of recitation;
   (d) patterning a first photoresist mask on the layer of non-oxidizing material with said photoresist defining a profile for the DEIS material;
   (e) etching the exposed areas through the said non-oxidizing material, through the said second layer of polysilicon;
   (f) etching the exposed DEIS areas;
   (g) stripping the first photoresist mask;
   (h) patterning a second photoresist mask on the layer of the non-oxidizing material; said second photoresist mask being operable to define at least one polysilicon floating gate electrode and polysilicon interconnections;
   (i) etching the exposed polysilicon areas;
   (j) stripping the second photoresist mask;
   (k) thermally oxidizing the structure for isolating at least one floating gate;
   (l) removing the layer of non-oxidizing material;
   (m) depositing a third layer of polysilicon on the second layer of polysilicon previously laid down in step (b) above; and
   (n) forming electrical interconnections and gate electrodes in said third layer of polysilicon.

2. The method of claim 1 wherein the semiconductor structure is being fabricated through a technique including the steps of formation of Recessed Oxide (ROX), gate oxidation and polysilicon gate deposition.

3. The method of claim 1 wherein the non-oxidizing material of step (c) includes silicon nitride.

4. The method of claim 1 wherein an in situ chemical vapor deposition (CVD) technique is used to deposit the first and second layers of silicon rich oxide and the first layer of silicon dioxide.

5. The method of claim 4 wherein the first layer of silicon rich oxide is approximately 20 nm thick, the first layer of silicon dioxide is approximately 15 nm thick and the second layer of silicon rich oxide is approximately 20 nm thick.

6. The method of claim 5 wherein the silicon rich oxide is being deposited with a low pressure CVD reactor having a flow rate of 20 cc/minute of 100% silane ($SiH_4$), 100 cc/minute of nitrous oxide ($N_2O$), a temperature of 750° C. and a pressure of 750 millitorr.

7. The method of claim 5 wherein the second layer of silicon dioxide is being deposited at 7 cc/minute of $SiH_4$, 300 cc/minute of $N_2O$ at 750 millitorr and 750° C.

8. The method of claim 1 wherein the non-oxidizing material of step (d) defines a non-continuous profile for the DEIS.

9. The method of claim 1 wherein steps (e), (i) and (l) are being etched in a plasma etch using DE-100.

10. The method of claim 1 wherein step (f) is being etched in a buffered HF.

11. A method for fabricating an $E^2PROM$ comprising of the following steps:
   (a) fabricating a silicon substrate with at least one thin oxide region surrounded by thick oxide region;
   (b) depositing a first polysilicon layer on a silicon substrate;
   (c) depositing a DEIS material on top of the first polysilicon layer;
   (d) depositing a relatively thin second polysilicon layer on top of the DEIS;
   (e) depositing a layer of silicon nitride on top of said relatively thin second polysilicon layer;
   (f) patterning a photoresist mask on the silicon nitride layer;
   (g) etching the exposed areas through the said silicon nitride layer, and said second polysilicon layer and said DEIS material, and said first polysilicon layer;
   (h) stripping the photoresist;
   (i) thermally oxidizing the structure for isolating at least one floating gate;
   (j) removing the layer of silicon nitride;
   (k) depositing a third layer of polysilicon material; and (l) fabricating electrical interconnections and gate electrodes in said second layer of polysilicon material.

12. The method recited in claim 10 wherein the photoresist mask defines a coincident profile for the DEIS and the floating gate.

13. A method for incorporating a non-continuous DEIS material between two layers of polysilicon in an array of devices on an integrated circuit substrate comprising the following steps being performed in the order of recitation:
   (a) fabricating a silicon substrate with at least one thin oxide region surrounded by thick oxide region;
   (b) depositing a first polysilicon gate interconnect layer on the substrate;
   (c) patterning a first photoresist mask on the layer of the non-oxidizing material; said first photoresist mask being operable to define at least one polysilicon floating gate electrode and polysilicon interconnections;
   (d) etching the exposed polysilicon areas;
   (e) stripping the first photoresist mask;
   (f) depositing on the said first polysilicon gate interconnect layer a first layer of silicon rich oxide, a layer of silicon dioxide, a second layer of silicon rich oxide, a second layer of polysilicon and a layer of non-oxidizing material with the layers being deposited in the order of recitation;
   (g) patterning a second photoresist mask on the layer of non-oxidizing material with said photoresist defining a profile for the DEIS material;
   (h) etching the exposed areas through the said non-oxidizing material, through the said second layer of polysilicon;
   (i) etching the exposed DEIS areas;
   (j) stripping the second photoresist mask;
   (k) thermally oxidizing the structure for isolating at least one floating gate;
   (l) removing the layer of non-oxidizing material;
   (m) depositing a third layer of polysilicon on the second layer of polysilicon previously laid down in step (b) above; and
   (n) forming electrical interconnections and gate electrodes in said third layer of polysilicon.

14. A method for incorporating a non-continuous DEIS material between two layers of polysilicon in an array of devices on an integrated circuit substrate comprising the following steps:
   (a) fabricating a silicon substrate with at least one thin oxide region surrounded by thick oxide region;
   (b) depositing a first polysilicon gate interconnect layer on the substrate;
   (c) depositing on the said first polysilicon gate interconnect layer a first layer of silicon rich oxide, a layer of silicon dioxide, a second layer of silicon rich oxide, a second layer of polysilicon and a layer of non-oxidizing material with the layers being deposited in the order of recitation;
   (d) patterning a photoresist mask on the layer of non-oxidizing material with said photoresist defining a profile for the DEIS material;
   (e) etching the exposed areas through the said non-oxidizing material, through the said second layer of polysilicon;
   (f) etching the exposed DEIS areas;
   (g) etching the exposed polysilicon areas;
   (h) stripping the photoresist mask;
   (i) thermally oxidizing the structure for isolating at least one floating gate;
   (j) removing the layer of non-oxidizing material;
   (k) depositing a third layer of polysilicon on the second layer of polysilicon previously laid down in step (b) above; and
   (l) forming electrical interconnections and gate electrodes in said third layer of polysilicon.

* * * * *